United States Patent [19]

Roddy et al.

[11] Patent Number: 4,922,172

[45] Date of Patent: May 1, 1990

[54] MOTOR TEST APPARATUS, SYSTEM AND METHOD

[75] Inventors: Joseph T. Roddy; David A. Felt; David D. Eisenbraun, all of St. Louis, Mo.

[73] Assignee: Emerson Electric Co., St. Louis, Mo.

[21] Appl. No.: 211,445

[22] Filed: Jun. 23, 1988

[51] Int. Cl.⁵ ............................................. G01R 31/02
[52] U.S. Cl. ..................................... 318/490; 324/378; 324/158 MG
[58] Field of Search ............... 318/480, 565, 638, 650, 318/244, 246; 324/158 MG, 378, 379, 383, 390, 394, 402; 73/116, 117, 117.1, 117.2, 117.3, 118.1, 119 R, 116

[56] References Cited

U.S. PATENT DOCUMENTS

| | | | |
|---|---|---|---|
| 3,630,076 | 12/1971 | Staudt | 234/378 X |
| 4,194,129 | 3/1980 | Dumbeck | 318/490 X |
| 4,215,404 | 7/1980 | Bukhtiyarov et al. | 324/378 X |
| 4,222,040 | 12/1983 | Raider et al. | 318/490 X |
| 4,538,097 | 8/1985 | Tourneur | 318/490 |
| 4,604,559 | 8/1986 | Hawker et al. | 318/490 X |
| 4,659,976 | 4/1987 | Johansen | 318/490 X |
| 4,743,848 | 5/1988 | Krimm et al. | 318/490 X |
| 4,774,041 | 5/1988 | Strunk et al. | 318/490 X |
| 4,801,877 | 1/1929 | Herrick et al. | 324/158 MG |

Primary Examiner—Vit W. Miska
Assistant Examiner—A. Jonathan Wysaki
Attorney, Agent, or Firm—Polster, Polster and Lucchesi

[57] ABSTRACT

An electric motor is tested by sensing the phase of an alternating current waveform to be applied to the motor, and applying the waveform to the motor in response to the phase of the waveform reaching a preselected value to start the motor. The voltage and current are sampled at predetermined times measured from the application of the waveform to the motor until a predetermined number of voltage and current samples are obtained. Parameter samples are generated from the voltage and current samples, the parameter being a function of the applied voltage and current. The parameter samples are compared with a previously obtained set of reference parameter sample values, the reference sample values having error limits for each reference sample value. The motor is rejected if at least a predetermined number of the parameter samples fall outside the error limits for those particular samples.

39 Claims, 8 Drawing Sheets

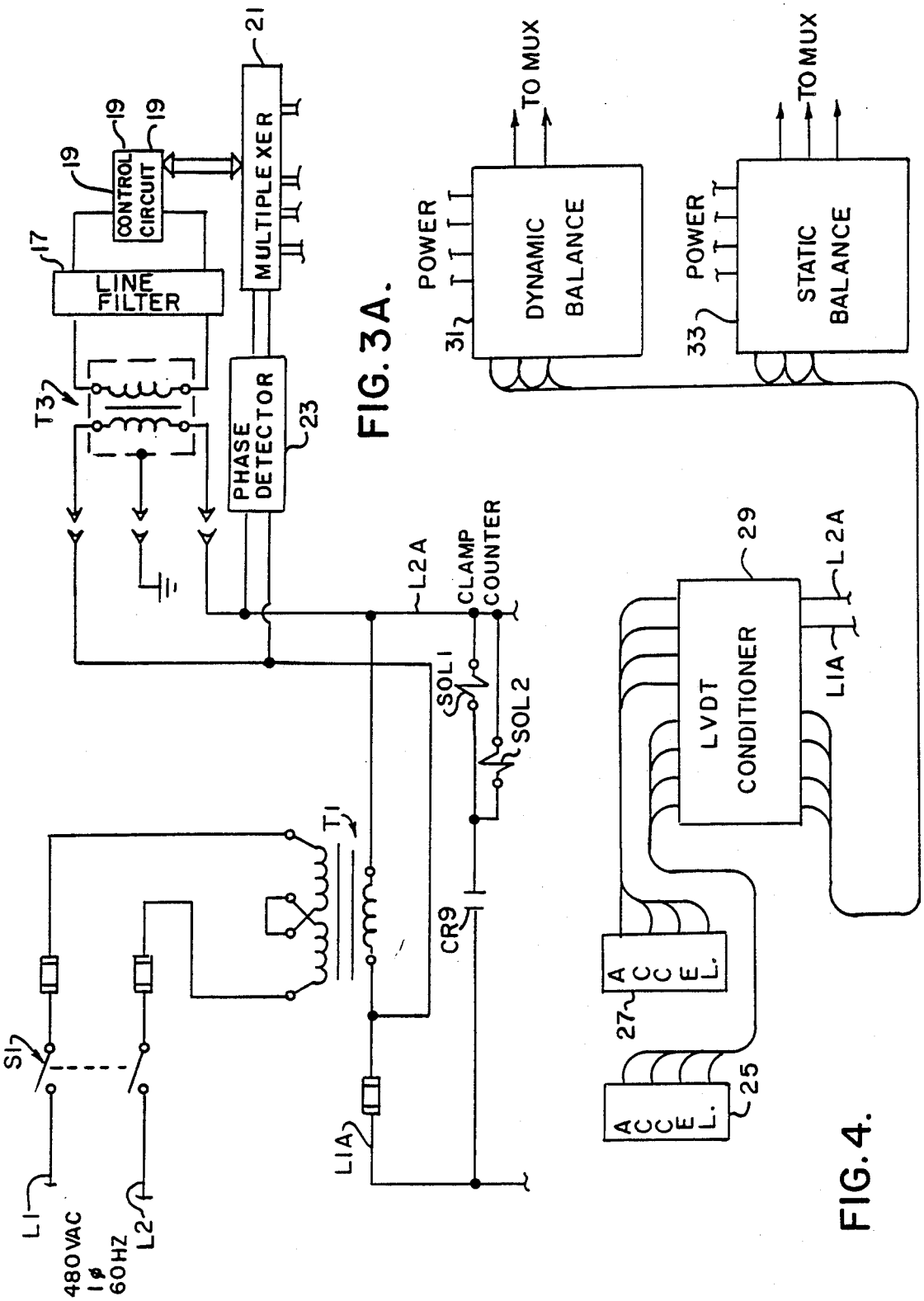

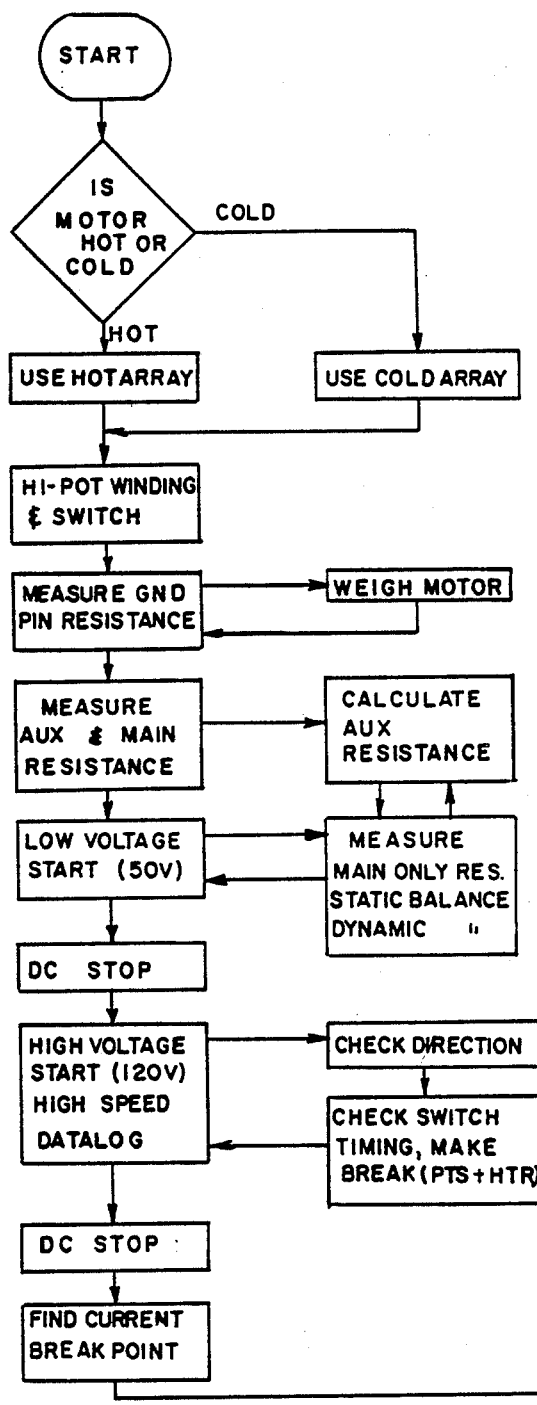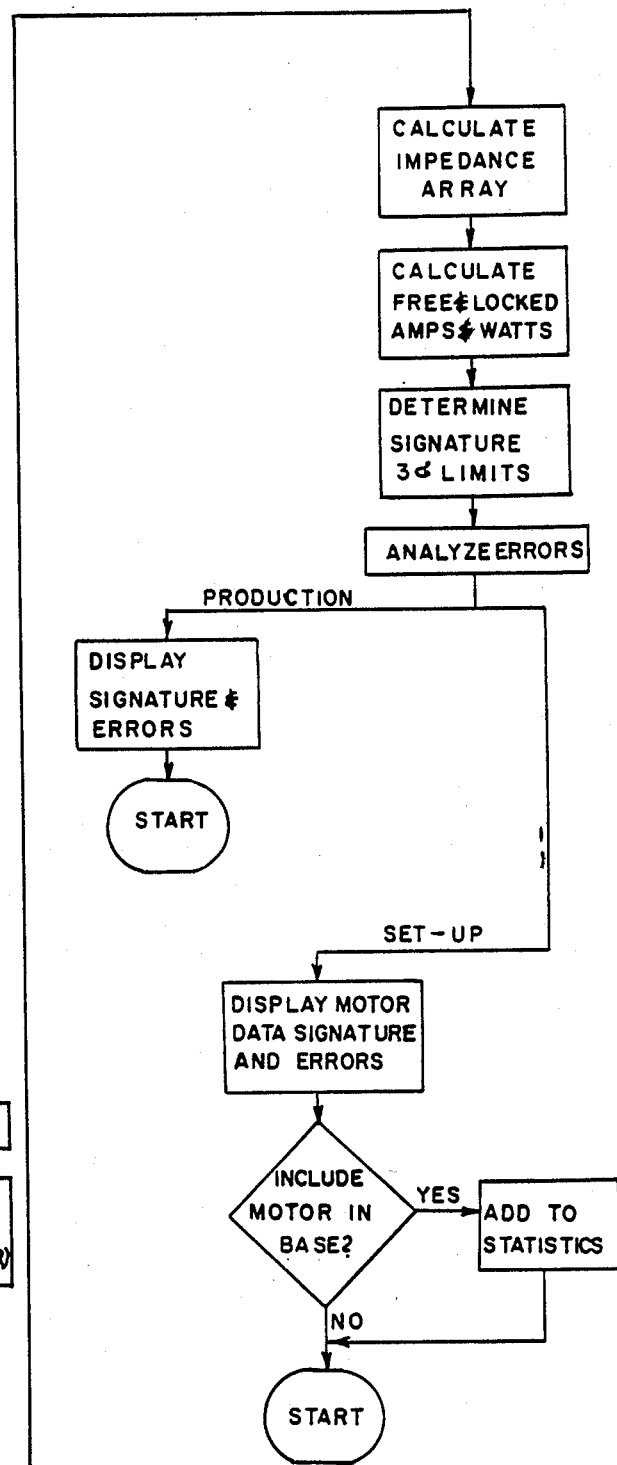
FIG. 9.

1

MOTOR TEST APPARATUS, SYSTEM AND METHOD

BACKGROUND OF THE INVENTION

This invention relates to testing apparatus for dynamoelectric machines, and in particular, to a test system and method for automatically performing a plurality of tests on a series of motors so that all motors in a series are tested.

It has long been the practice in the manufacture of dynamoelectric machines, and in particular, of electric motors, to run a series of operational and quality control checks to ensure that products produced by a motor plant, for example, are operating properly prior to shipment to a particular customer. Among the more common production tests imposed on motors during manufacture are a surge test of stator windings in which a high voltage surge is applied to the stator windings to check for wire damage that can result in an open circuit of the motor winding; a high pot or high potential test to check the motor windings for electrical shorts between windings and ground; and various start and run tests to ensure that the motor is operational.

With the growing concern over energy efficiency and zero-defect manufacturing, motor manufacturers more recently have been required to ensure that their motors meet other standards prior to shipment. For example, in addition to the above tests, the resistance of the motor's ground pin, the resistance of main and auxiliary windings, the static and dynamic balance of the motor, the free and locked rotor amps, along with other motor parameters are now often tested.

The direction of rotation of a motor also requires verification in many instances Again, with production volumes, it has heretofore been difficult to consistently check motor rotation, the historic test being a visual observation of the direction of rotation. In some instances a visual inspection may be difficult, and in any case such an inspection is prone to error and takes too much time.

Many of these concerns have been addressed in U.S. Pat. No. 4,383,439 to MacCormack et al. which discloses an automatic motor test board.

Even the MacCormack et al apparatus could be improved however. For example, additional tests are often required other than those performed by the MacCormack et al apparatus. Moreover, with the apparatus of MacCormack et al the testing process is fairly lengthy, which makes it disadvantageous to test all motors in a particular production run in a reasonable time and at a reasonable cost.

A further complication in motor testing is that the parameters of the motor vary with temperature of the motor, which often requires that all the testing be completed before the temperature of the motor changes appreciably.

Other motor defects are not easily detected by conventional systems even though they are often apparent to a human observer. Such defects are evidenced by a peculiar sound during motor operation. Such a sound is readily identified by a human observer, but has heretofore been undetectable by automated test equipment. Of course, using such a human observer increases the cost and time of the testing while increasing the opportunity for error.

SUMMARY OF THE INVENTION

Among the various objects and features of the present invention may be noted the provision of a motor testing system and method which automatically tests and measures a large variety of motor parameters.

Another object is the provision of such a motor testing system and method which performs the tests so rapidly that all motors in a production run may be tested economically.

A third object is the provision of such a motor testing system and method which facilitates the automatic determination of direction of motor rotation.

A further object is the provision of such a motor testing system and method which imposes no load on the motor during test.

A fifth object is the provision of such a motor testing system and method which conducts a variety of independent tests on a given motor in a minimal amount of time.

A sixth object is the provision of such a motor testing system and method which automatically compensates for the effect of motor temperature.

A seventh object is the provision of such a motor testing system and method which accurately detects defects evidenced by motor sounds during operation.

Other objects of this invention will be apparent to those skilled in the art in light of the following description and accompanying drawings.

In accordance with this invention, generally stated, a method of the present invention for testing an electric motor having a frame and motor windings, includes the steps of sensing the phase of an alternating current waveform to be applied to the windings of an electric motor to be tested, and applying the alternating current waveform to the windings in response to the phase of the waveform reaching a preselected value to start the motor. The voltage and current applied by the alternating current waveform to the motor windings are sampled at predetermined times measured from the application of the waveform to the motor until a predetermined number of voltage and current samples are obtained. Parameter samples are generated from the voltage and current samples, the parameter being a function of the applied voltage and current. The parameter samples are compared with a previously obtained set of reference parameter sample values, the reference sample values having error limits for each reference sample value. The motor is rejected if at least a predetermined number of the parameter samples fall outside the error limits for those particular samples.

The apparatus of the present invention for sequentially testing a series of nominally identical motors, each having a frame and motor windings, includes circuitry for sensing the phase of an alternating current waveform to be applied to the windings of each electric motor to be tested, and circuitry for applying the alternating current waveform to the windings of each motor in sequence in response to the phase of the waveform reaching a preselected value to start the motor. The apparatus also includes circuitry for sampling the voltage and current applied by the alternating current waveform to the motor windings at predetermined times measured from the application of the waveform to the motor under test until a predetermined number of voltage and current samples are obtained. Additional circuitry is provided for generating parameter samples from the voltage and current samples, the parameter being a function of the applied voltage and current, for comparing the parameter values with a previously obtained set of reference parameter sample values, the reference sample values having error limits for each reference sample value, and for determining if at least a predetermined number of the parameter samples fall outside the error limits for those particular samples.

A motor test system of the present invention includes a platform fixed at one end and free at the opposite end. Of course the platform could be merely a portion of a robot arm which holds the motor during testing if it is desired to fully automate the manufacture and testing of the motors. Structure is provided for fixedly securing a motor to be tested to the platform so that torque generated by the motor, when running, is applied to the platform. An accelerometer is included for sensing the direction of the torque applied to the platform by the running motor and for supplying an output indicative of said torque direction. Electronic logic circuitry is responsive to the accelerometer for determining solely from the output of the accelerometer the direction of rotation of the motor under test.

BRIEF DESCRIPTION OF THE DRAWINGS

In the drawings.

FIGS. 3A and 3B are electrical schematics of control circuitry used in the apparatus of the present invention;

FIG. 4 is an electrical schematic of balance sensing circuitry used in the apparatus of the present invention;

FIG. 9 is a flowchart illustrating the operation of the method and system of the present invention.

Similar reference characters indicate similar parts throughout the several views of the drawings.

DESCRIPTION OF THE PREFERRED EMBODIMENT

Figure 1:
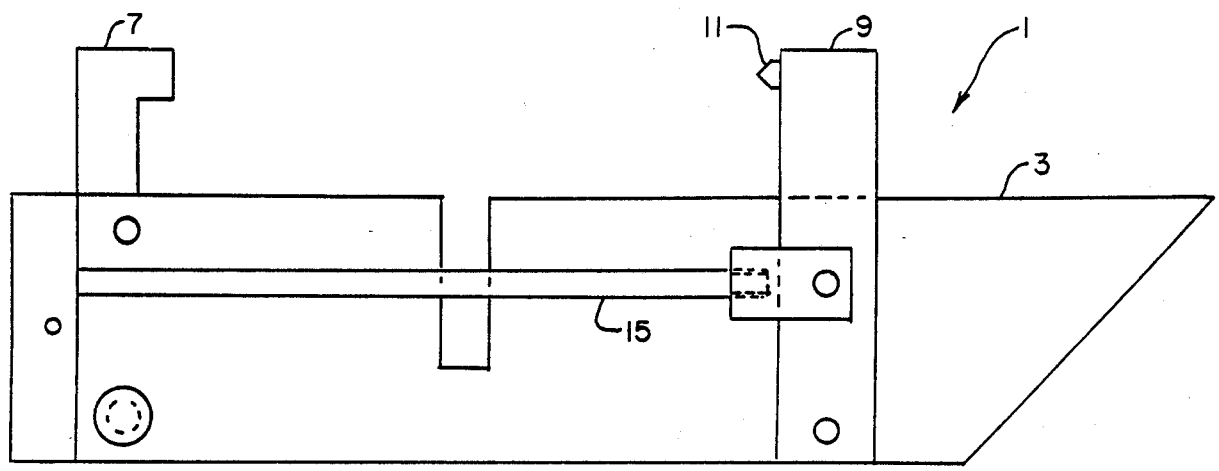
FIG. 1 is a side elevation of a motor clamping platform used in the apparatus of the present invention.

Motor testing apparatus 1 (FIGS. 1 and 2) of the present invention includes a platform 3 on which a motor 5 to be tested is removably mounted. The mounting mechanism (illustrated best in FIG. 1) includes a pair of opposed clamps 7 and 9 disposed generally at opposite sides of the platform. The particular shape of the clamps is of course determined by the geometry of the particular model or type of motor under test. It should be noted, however, that clamp 9 includes a pin 11 which not only serves to mechanically hold motor 5 in place but also provides an electrical connection thereto, as described below.

Clamps 7 and 9 are movable with respect to each other along a track 13 in platform 3. Preferably one of the clamps is fixed with respect to the platform while the other is movable with respect thereto by a solenoid actuated rod 15. In this manner, the control circuitry of the present invention (described below) at the proper time may automatically clamp motor 5 to be tested into the proper position on platform 3.

Power is supplied to the apparatus of the present invention on a pair of lines L1 and L2 (FIG. 3A). For example, this power could be single phase, sixty hertz power at some commonly available voltage such as 480V or 240V. The power is supplied through a manually operable switch S1 and a pair of fuses to a transformer T1 whose secondary supplies alternating current power at a predetermined reduced voltage to the rest of the circuitry of the apparatus.

The secondary of transformer T1 is connected to a second transformer T3 which steps down the voltage even further and supplies it to a line filter 17 whose filtered output is supplied to a control circuit 19. Control circuit 19 may be any of a number of commercially available computer-based or hardwired control circuits such as the computer-based processors and circuits sold by Pro-Log Corporation of Monterey, Calif. What is required is that control circuit 19 accept various inputs indicative of the state of the apparatus of the present invention and issue control signals in response thereto to control the operation of the apparatus.

Control circuit 19 is connected to the rest of the circuitry of the present invention through a multiplexer 21 or other suitable interface circuitry. One of the inputs to multiplexer (MUX) 21 shown in FIG. 3A is a phase detector 23 for detecting the phase of the waveform appearing across the secondary of transformer T1. As will become apparent, control circuit 19 uses this phase information in determining when in the cycle of the waveform to apply power to the motor under test. The phase detector may be of any conventional construction.

Figure 2:
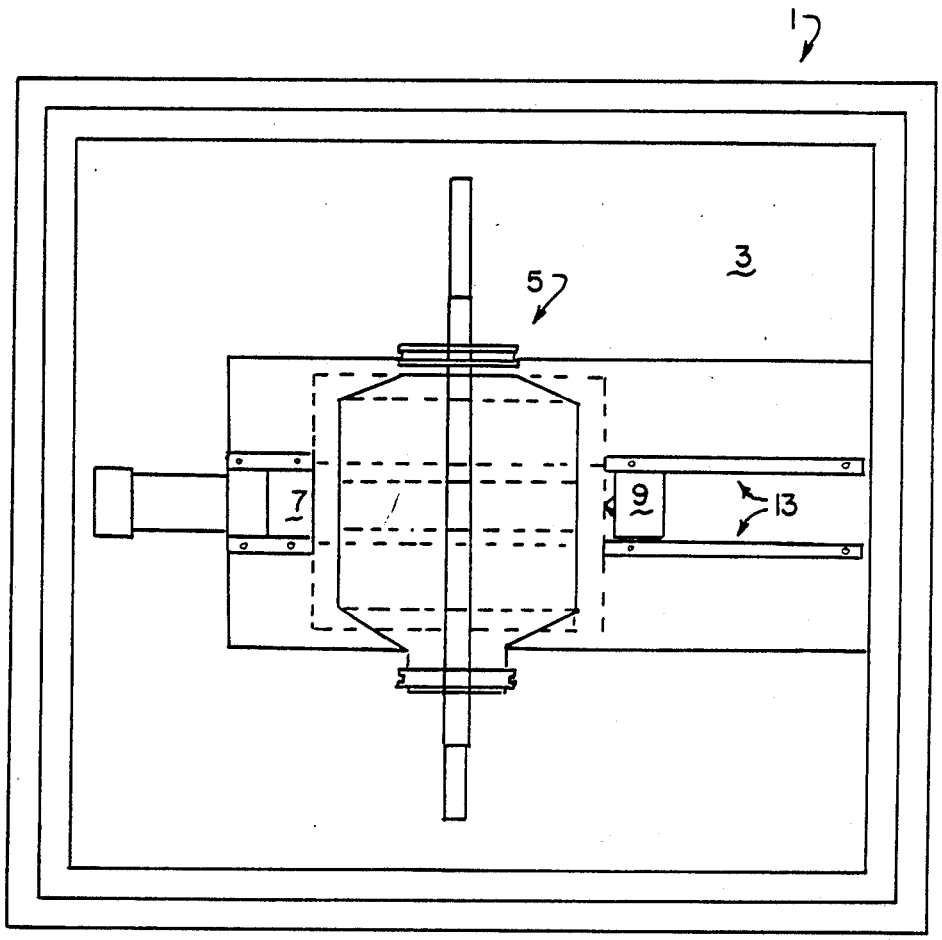
FIG. 2 is a top plan illustrating a motor clamped into position by the platform of FIG. 1.

The secondary of transformer T1 is connected through a fuse to a line L1A and directly to a line L2A to provide power to the remainder of the circuitry of the present invention. For example, a set of relay contacts CR9 in series with a solenoid SOL1 are connected across lines L1A and L2A. When control circuit 19 closes relay contacts CR9 (by energizing its associated coil, not shown) solenoid SOLI is energized. This solenoid operates rod 15 to clamp motor 5 in position as shown in FIG. 2. At the same time closure of relay contacts CR9 energizes a second solenoid SOL2 to operate a counter (not shown) which keeps track of the number of motors tested.

Lines L1A and L2A provide power for various direct current power supplies (see FIG. 3B) such as a +12V supply PS1, a +24V supply PS2, two 0.1A supplies PS3 and PS4, and a +/−15V supply PS5.

A solid state relay SSR4 (shown at the bottom of FIG. 3B) is connected in series with an indicator light LT2 between lines L1A and L2A. When control circuit 19 detects a fault it indicates this fact by closing relay SSR4 to light fault indicator light LT2.

Also connected between lines L1A and L2A are a series of solid state relays and relay coils for governing the operation of the circuitry of the present invention. Each solid state relay is connected in series with a correspondingly numbered relay coil so that when control circuit 19 closes the circuit through one of the solid state relays, its associated relay coil is energized.

Figure 3B:
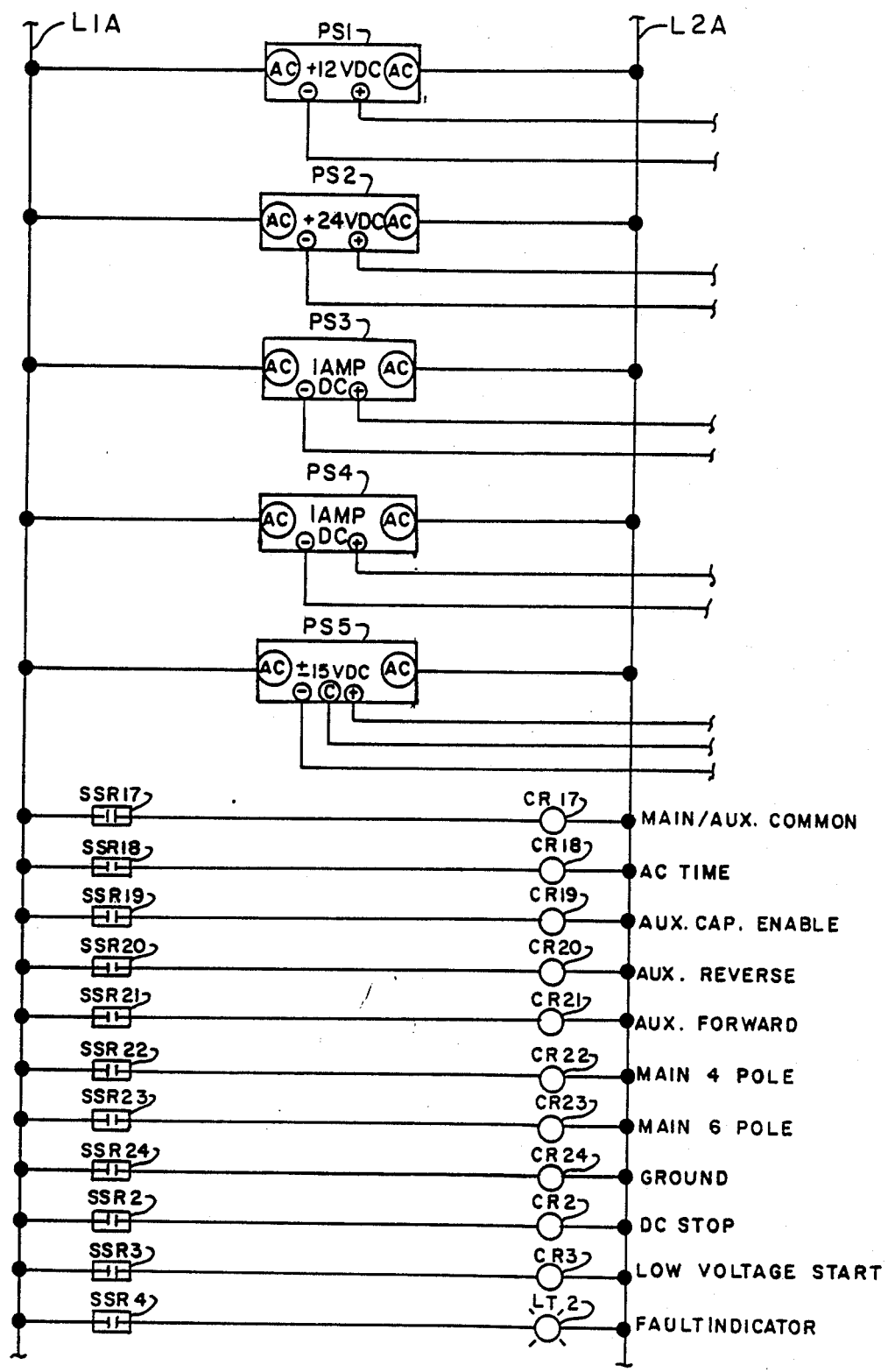

From the bottom of FIG. 3B, the solid state relays and their associated relay coils are as follows: A solid state relay SSR3 is connected in series with the coil of a relay CR3. When control circuit 19 closes relay SSR3, the coil of relay CR3 is energized to initiate the low voltage start test as described below. A solid state relay SSR2 and relay CR2 are used by the control circuit to provide direct current braking for the motor under test.

Control circuit 19 provides a ground for the test circuitry of the present invention by closing a solid state relay SSR24 and thereby energizing the coil of a relay CR24.

The particular test circuitry disclosed herein is designed to handle both six- and four-pole motors with an auxiliary winding. The auxiliary winding may in addition be energized in both the forward and reverse direction with the particular circuitry shown. The present invention, however, is not limited to such a motor or motors, but rather is of general applicability to all electric motors.

Control circuit 19 uses a solid state relay SSR23 and its associated relay CR23 to provide a circuit path to the main winding of a six-pole motor, while a solid state relay SSR22 and its associated relay CR22 perform the same function for the main winding of a four-pole motor. Forward direction energization of the auxiliary winding is accomplished by means of a solid state relay SSR21 and it associated relay CR21. Reverse direction energization of the auxiliary winding, on the other hand, is governed by a solid state relay SSR20 and its associated relay CR20.

The auxiliary winding has a capacitor C1 (FIG. 7B) associated therewith, and this capacitor is inserted into the circuit by a solid state relay SSR19 and its associated relay CR19 under the control of control circuit 19. The control circuit can also control various times associated with the testing of motor 5 by controlling various solid state relays such as relay SSR18 (which controls the AC time for the testing of the motor) to energize the coils of their associated relays.

The common for all windings is provided by the closure of a solid state relay SSR17, which energizes the coil of its associated relay CR17.

Turning to FIG. 4, one of the sensor circuits of the present invention is shown. This particular circuit senses the direction of rotation and static and dynamic balance of the motor under test. Platform 3 on which motor 5 is clamped for testing is free along three sides and is fixed only along one edge of the platform. As a result the platform floats and torque generated by the motor under test causes the platform itself to move. This movement is sensed by a pair of accelerometer sensors 25 and 27 which are fixed with respect to the platform in such a manner that they detect motion thereof.

The outputs of sensors 25 and 27 are supplied to a conditioning circuit 29 whose output is digitized and supplied by a pair of interface circuits 31 and 33 to the multiplexer 21. The output of interface circuit 31 represents the dynamic balance of the motor under test, while the output of interface circuit 33 represents the static balance. Sensors 25 and 27, conditioning circuit 29, and interface circuits 31 and 33 are standard, commercially available circuits whose construction does not constitute part of the present invention.

Figure 5:
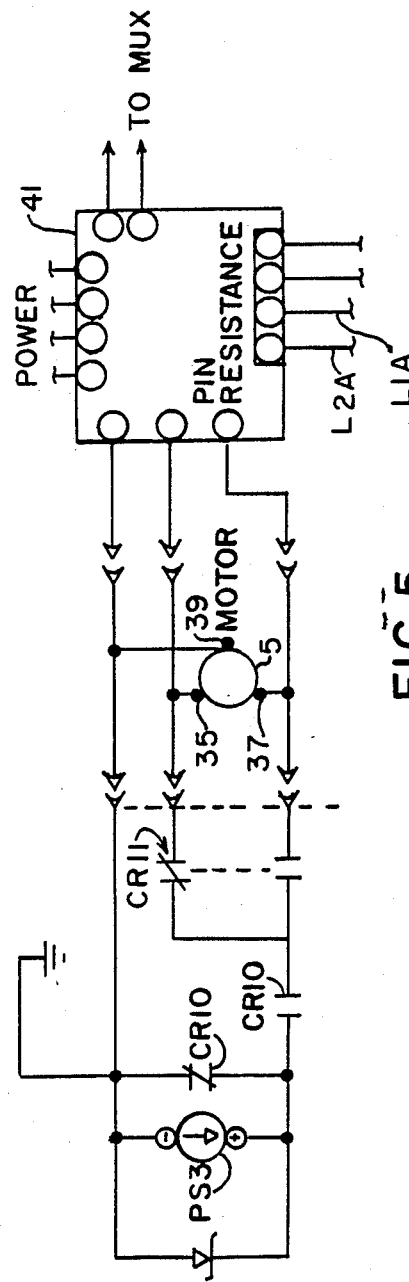
FIG. 5 is an electrical schematic of resistance sensing circuitry used in the apparatus of the present invention.

FIG. 5 illustrates yet another sensing circuit of the present invention. This circuit senses the ground pin resistance of the motor under test and the resistance of the winding insulation to ground. The circuit of FIG. 5 includes the 0.1A power supply PS3 for supplying current at a controlled level to the circuit. The normally closed contacts of relay CR10 are connected across power supply PS3 and the normally open contacts of that relay are connected to the positive terminal of the supply. The normally open contacts of relay CR10 are connected through the normally closed contacts of a relay CR11 to a first electric contact 35 and through the normally open contacts of relay CR11 to a second electric contact 37. Electric contacts 35 and 37 are in contact with the winding insulation and the ground pin of the motor under test. A third contact 39, carried by clamp 9 is also in contact with the motor. Contact 39 is directly connected to the negative terminal of power supply PS3. When the coil of relay CR10 (not shown) is energized by control circuit 19, and relay CR11 is unenergized, current from supply PS3 flows through the normally open contacts of relay CR10 and the normally closed contacts of relay CR11 to contact 35. The resistance between contacts 35 and 39 is thereby reflected in a signal applied to a pin resistance interface circuit 41, which circuit provides a digitized output representing that resistance to the multiplexer.

Similarly, when the coils of both relay CR10 and CR11 are energized, current from supply PS3 is applied through the normally open contacts of relay CR10 and the normally open contacts of relay CR11 to electric contact 37. As a result a signal representing the resistance between contacts 37 and 39 is applied to pin resistance interface circuit 41, and the digitized output representing that signal is supplied to the multiplexer.

Figure 6A:
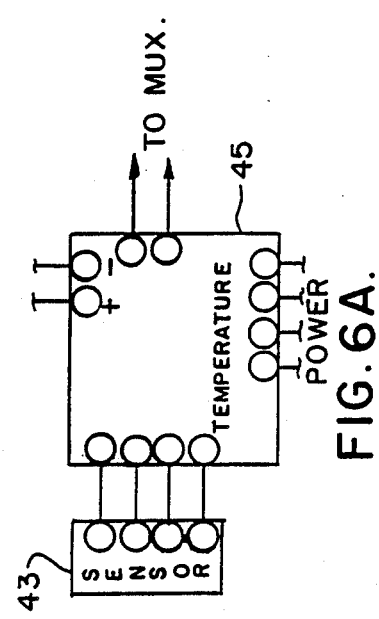
FIG. 6A is an electrical schematic of temperature sensing circuitry used in the apparatus of the present invention.

The results of the testing of motor 5 depend in some instances on the temperature of the motor. For that reason, the motor testing system of the present invention includes a conventional infrared sensor 43 (FIG. 6A) disposed on platform 3 in such a location that it may sense the temperature of the motor under test. The sensor is connected to a conventional temperature interface circuit 45. Temperature interface circuit 45 digitizes the output of temperature sensor 43 and supplies that signal, representing the temperature of the motor, to the multiplexer.

Figure 6B:
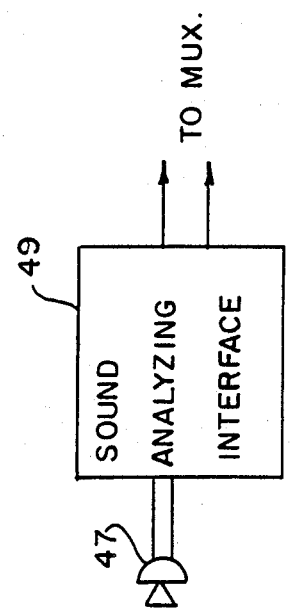
FIG. 6B is an electrical schematic of sound sensing circuitry used in the apparatus of the present invention.

In a similar manner, the present system includes a microphone 47 (FIG. 6B) disposed adjacent motor 5 on platform 3 to sense the noise made by the motor during testing. The output of microphone 47 is supplied to a sound analyzing interface circuit 49. The interface circuit analyzes the output of the microphone (using Fourier analysis or similar techniques) to detect patterns of sound indicative of a fault in the motor. The interface circuit digitizes this information and supplies it to multiplexer 21. Alternatively, sound analyzing interface circuit 49 may simply digitize the signal from microphone 47, leaving it to control circuit 19 to analyze the digitized signal.

Figure 7B:
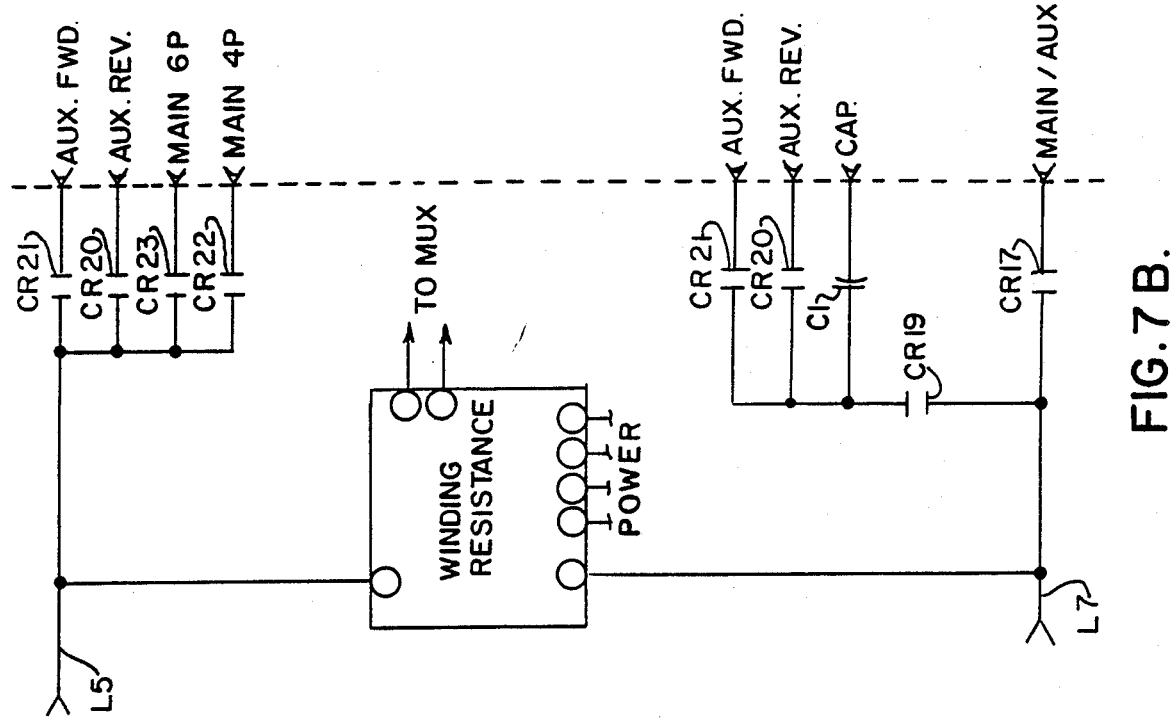
FIG. 7A and 7B are electrical schematics of power supplying and sampling circuitry used in the apparatus of the present invention.
Figure 7A:
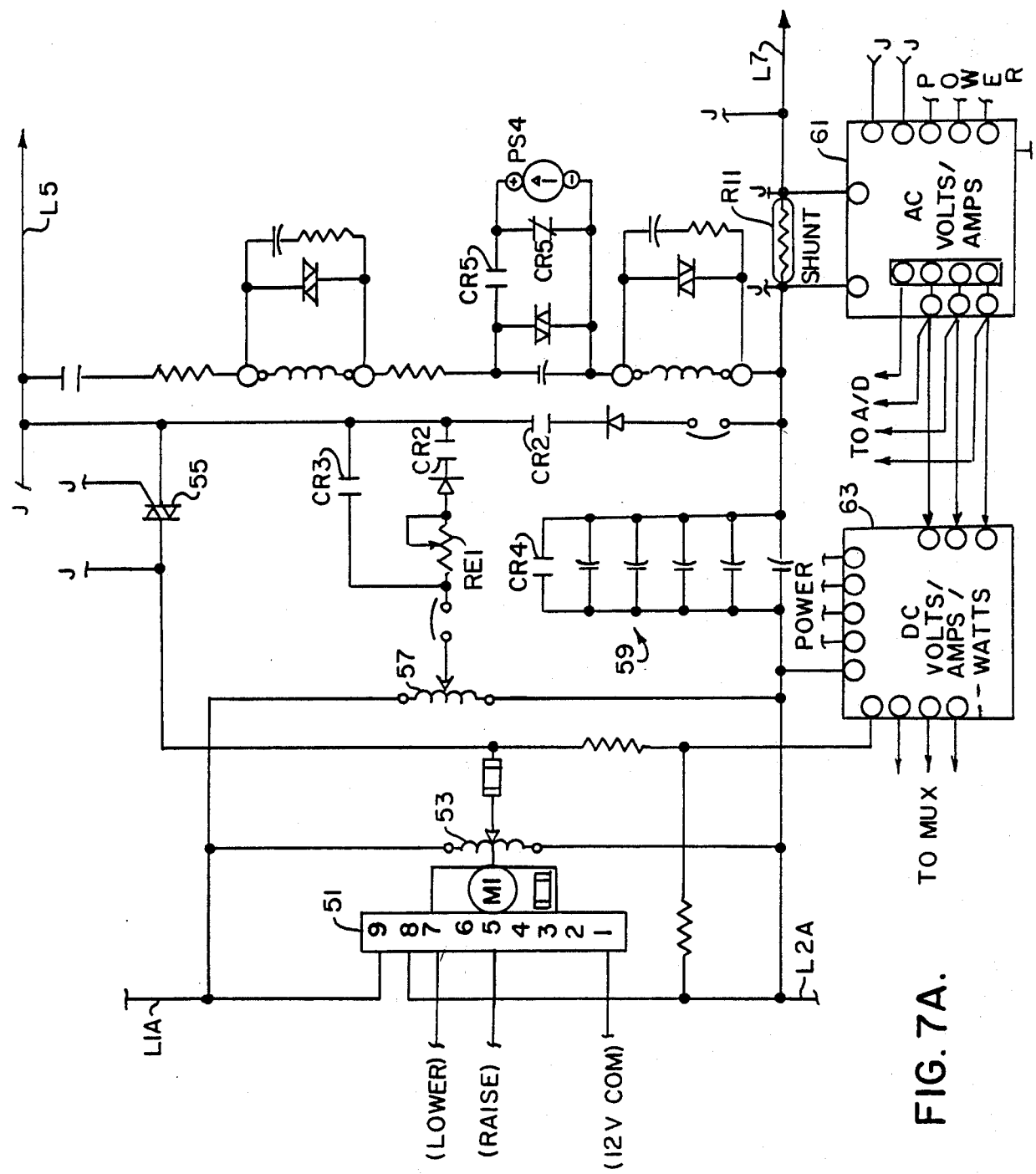

Turning to FIG. 7A, lines L1A and L2A are connected to a plug 51 for a motor M1 used, as desired, to adjust the positioning of one or more items of the test system, such as one of the clamps or one of the plug assemblies, with respect to the motor under test. To this end, plug 51 includes a pair of inputs for "lower" and "raise" control signals for motor M1

Immediately to the right of motor M1 is shown a variable autotransformer 53 connected between lines L1A and L2A. The tap of autotransformer 53 is connected through a fuse and a triad 55 to a line L5 connected to one side of the motor windings (see description in connection with FIG. 7B below) to provide power at the desired level (e.g., 120V) to motor 5. Control signals for triac 55 and for all triacs shown in these drawings are generated by standard, conventional triac control circuitry which is not shown for clarity. For reference, the connections with the triac control circuitry are indicated on the drawings by the letter "J".

Also connected between lines L1A and L2A is a second variable autotransformer 57. The tap of autotransformer 57 is connected through the normally open contacts of relay CR3 to line L5, that is, to one side of the motor windings. The tap of autotransformer 57 is chosen so that a relatively low voltage (such as 50V) is applied when relay CR3 is energized to perform a low voltage start test on motor 5.

A rheostat RE1 in series with a diode and one set of normally open contacts of relay CR2 is also connected between the tap of autotransformer 57 and line L5, one of the motor power lines. The other set of normally open contacts of relay CR2 is connected in series with a second diode and a capacitance bank 59 between line L5 and line L2A. When the coil of relay CR2 is energized, these two sets of normally open contacts close and direct current power is supplied to the motor windings. This current is direct current because of the two diodes interposed in the respective circuits. The direct current, under control of control circuit 19 provides direct current braking of the motor between tests to minimize the total testing time.

Also shown at the bottom of FIG. 7A is a shunt resistor R11 which is used to measure or sample the voltage and thereby determine the current flowing through the motor windings. Specifically, shunt resistor R11 is connected in series with capacitance bank 59 between line L2A and a line L7.

As can be seen in FIG. 7B, line L7 and line L5 function to supply power to the motor windings of the motor under test. For example, when control circuit 19 causes the normally open contacts of relay CR23 to close to connect line L5 with the main winding of a six-pole motor and causes the normally open contacts of relay CR17 to close to connect line L7 with the common for the main and auxiliary windings, power is applied to the main winding. Operation is similar for the other windings whose connections are shown in FIG. 7B.

Also shown in FIG. 7B is a conventional energized winding resistance sensor which measures the resistance of the various windings and supplies a digital signal representing the measured resistances to multiplexer 21.

It should be noted that all the current flowing through the windings of the motor during testing flows through shunt resistor R11. The winding current can therefore be measured by means of this resistor. An AC volt/amp sensing circuit 61 is connected across shunt resistor R11 to make such measurements. The actual voltage measurement is made separately on the same board as the triac control circuitry (not shown) in a conventional manner and the voltage signal is supplied from that board to sensing circuit 61.

The output of AC volt/amp sensing circuit 61 is supplied to an analog-to-digital converter (not shown) and to a DC volts/amps/watts interface circuit 63. That circuit conditions the values of the current and voltage signals from sensing circuit 61 to eliminate the problem caused by zero crossings of those signals. That conditioning can be, for example, an averaging process or other process which gives not the instantaneous value of the impedance but rather a continuing value proportional to the impedance. These values are supplied to multiplexer 21 where they are sampled by control circuit 19 at regular intervals as described below.

Figure 8:
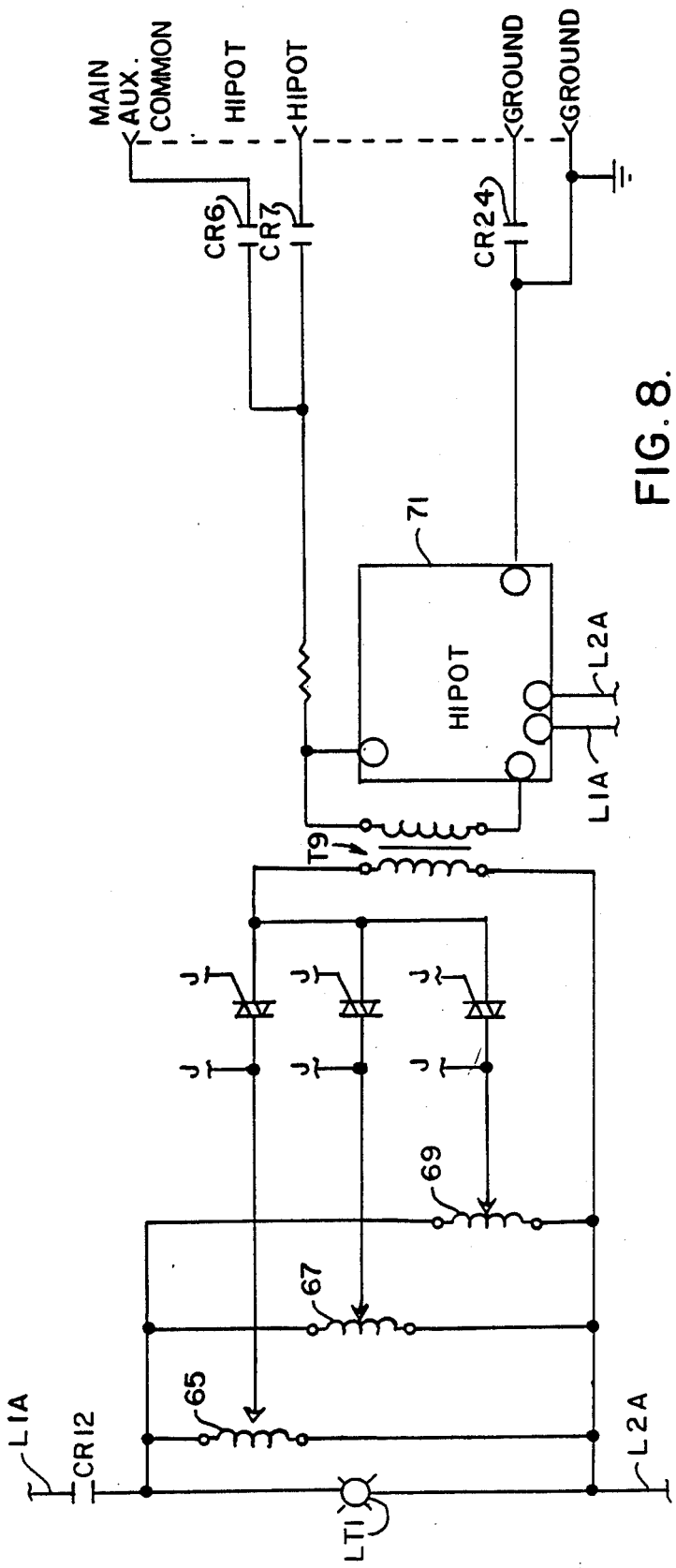
FIG. 8 is an electrical schematic of hipot applying circuitry used in the apparatus of the present invention.

Turning to FIG. 8, there is shown the circuitry for providing the relatively high voltage to the windings for the hipot test. This circuitry includes a set of three variable autotransformers 65, 67, and 69 connected in parallel between the normally open contacts of relay CR12 and line L2A. When the normally open contacts close, current flows between lines L1A and L2A through these autotransformers and through an indicator lamp LT1. The taps of autotransformers 65, 67, and 69 are connected through three triacs to a common point. This common point is connected to one side of the primary of a transformer T9, the other side of the primary being connected to line L2A. The secondary of transformer T9 is connected to a Hipot interface circuit 71 whose other inputs include lines L1A and L2A ground. The high voltage output of circuit 71 is supplied (by closing the normally open contacts of relay CR6) to the Main/Aux Common terminal of the motor under test. Similarly, it is supplied to the Highpot terminal by closing the normally open contacts of relay CR7.

Operation of the motor test system of the present invention is illustrated in FIG. 9. This Figure sets out in general the steps followed by the system of the present invention, under control of control circuit 19, in two cases: (1) during set-up for a particular model or type of motor, and (2) during production testing of a series of nominally identical motors from a production run. It should be realized, however, that the particular order of the tests performed are not a feature of the present invention.

In the first case, set-up of the system for a particular motor, a predetermined number of hand-selected motors (for example, four motors) are manually inspected for correct number of turns, etc. After manual inspection these motors are sequentially put through the testing process set forth in FIG. 9. Specifically, the first motor 5 is clamped into position on platform 3 and its temperature is sensed by temperature sensor 43. If the temperature is at or above a certain threshold, the control circuit records the test results as being those of a "hot" motor, while is the temperature is below the threshold, the test results are recorded as being those of a "cold" motor.

Thereafter, the Hi-pot winding and switch test is run, the ground pin resistance is measured, the motor is weighed, and the parallel resistance of the Auxiliary and main windings is measured. Other similar tests could, of course, be done at this time as well. The Low voltage start test is then performed, at a voltage of approximately 50V. During this test the "main only" winding resistance and the static and dynamic balance of the motor are checked.

To expedite the testing, after the low voltage start test, the motor is brought to a stop using direct current braking. Once stopped, the motor is then put through the high voltage start test, at a voltage of approximately 120V. During this test the direction of rotation of the motor is checked using the accelerometer sensors 25, 27 described above, and various switch timing tests are performed as well. With respect to testing the direction of rotation, as described above the motor torque is applied to platform 3 since motor 5 is held securely in place on the platform. Since the platform is fixed at one end and free at the other, the motor torque upon startup causes the platform to move. Any movement, of course, is reflected in the output of accelerometer sensors 25 and 27. The torque of the motor is thus reflected as a movement of the platform which sensors 25 and 27 detect. Since the direction of rotation of the motor determines the direction of the torque, the direction of movement of the platform upon startup is determined by the direction of rotation of the motor. Sensors 25 and 27, therefore, sense the torque on (or motion of) the motor frame during starting and control circuit 19 determines the direction of rotation from the output of these sensors.

The key to the speed with which the present system completes its various tests, however, lies in the data or samples which control circuit 19 logs during this portion of the testing. It has been discovered that the impedance and current of a motor change about 10-to-1 from locked rotor to running free, and that this is very repeatable, including transients. For example, in FIG. 10 a typical set of curves are shown. These curves represent the applied voltage to the motor, V, the motor current, I, and a continuous function Z which is proportional to the motor impedance and is computed from the running value of voltage and current. Note that Z is not the instantaneous impedance, which is not a continuous function, but rather is obtained by taking magnitudes of the quantities involved or through an averaging process.

Figure 10:
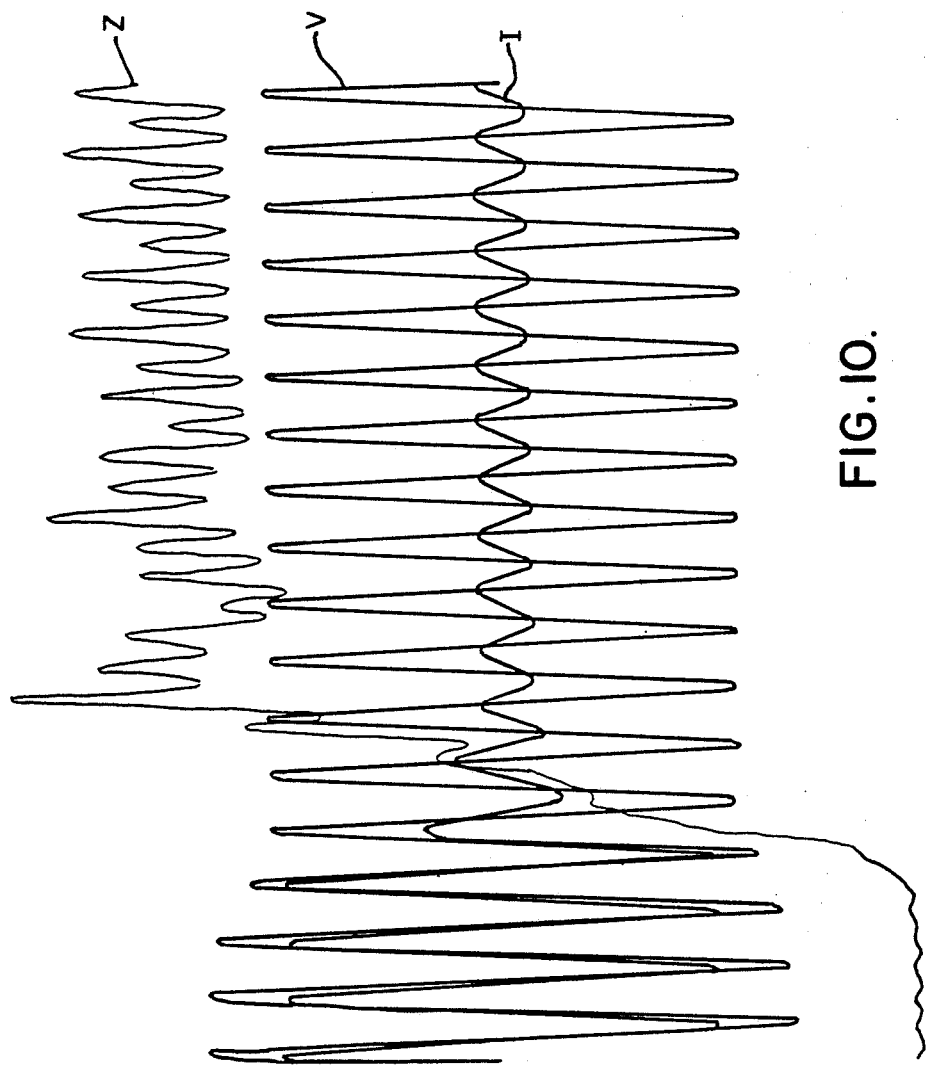
FIG. 10 is a graphic representation of a typical result of sampling the voltage and current in the motor windings using the present invention.

By ensuring that the power is applied to the motor or motors under test at the same time with respect to the sixty cycle power waveform, and particularly by choosing a point in that waveform where the transients in the current are least, the reproducibility of the curves of FIG. 10 becomes even higher. This point where the transients are at a minimum for many motors is approximately equal to the power factor of the motor at locked rotor. For example, for many motors, this point is between seventy and eighty degrees after the negative to positive zero crossing of the waveform. Such curves thus become the basis for checking various electrical and physical characteristics of the motors quickly and reliably. Because the impedance is related to speed and the speed is dependent on torque and time, this provides a way to check the torque and impedance of the motor from locked rotor to running free. Anything which affects the electrical performance of the motor (wire size, turns, rotor endring, or stacking for example) is detected by a change in the "Time-Impedance" relation.

The "Time-Impedance" relation is determined by the control circuit 19 by taking a predetermined number of samples (e.g. 512 samples) of the motor current and voltage and from those voltage and current samples computing a second predetermined number of values of continuous impedance (e.g. thirty-two impedance values). For example, if voltage and current samples are taken for each of the first sixteen cycles of the voltage waveform, and during each cycle of the voltage waveform thirty-two samples are taken, a total of 512 samples are obtained from the first sixteen cycles of the waveform. An impedance value is computed for the first cycle using the voltage and current samples for that cycle. Then a second impedance value is computed using the sixteen voltage and current samples for the last half of the first cycle and the additional sixteen voltage and current samples for the first half of the second cycle. Next a third impedance value is computed using the thirty-two voltage and current samples for the second cycle. Then a fourth impedance value is computed using the sixteen voltage and current samples for the last half of the second cycle and the additional sixteen voltage and current samples for the first half of the third cycle, and so on until thirty-two continuous impedance values are computed for the first sixteen cycles of the voltage waveform In this manner a running average of the impedance is computed.

During set-up these computed continuous impedance values are stored as parameter values to which sampled values for later motors can be compared. These values are displayed by the system during set-up for manual examination so that an operator can determine if that particular motor should be included in the statistics for acceptable motors. This process is repeated a number of times with a relatively large member of motors and each acceptable motor is included in the reference data so that an acceptable variance for the parameter values at each sampled point is computed. As more motors are tested, the variances become larger, so that motors originally rejected as being outside the desired limits may be accepted upon retest. The set-up procedure is thus a recursive process which continues until the operator has obtained satisfactory statistics for the type or model of motor under test.

When sample parameter values are compared against the reference values, the results are recorded as a series of "+"s, "0"s or "−"s. These form a signature for the particular motor under test which provides a great deal of information about the motor. It has been found that different defects have different signatures, so that an examination of the signature of a particular motor can immediately reveal and identify defects in that motor. Those sample parameter values which fall outside the acceptable variances, discussed above, are therefore indicative of a motor fault or defect (which can be identified by the signature as described above). If a predetermined number of these sample parameter values fall outside the error limits for those particular samples, the motor is rejected. The predetermined number is preferably one, although depending on the application one may desire a higher predetermined number of out-of-limits sample values before rejecting the motor.

The voltage and current samples taken by control circuit 19 are equally spaced in time, although the present invention is not limited to equally spaced samples. Samples must be taken often enough, however, to ensure that the resulting signatures reflect defects which are present in the motor.

It should be appreciated that after the samples are taken for the motor under test, the system rapidly (i.e., within a few seconds) computes various results for that motor. The current breakpoint (shown in FIG. 10) is readily available from the sampled data, as is the impedance array of thirty samples itself. Moreover, the locked rotor amps of the motor is immediately available from the first cycle sample. The free speed amps value is also computed, along with the watts and power factor for the motor. With respect to power factor, since the power factor in general depends on the relationship between the applied voltage and the load current, the power factor is easily computed by comparing the voltage and current samples. The control circuit then (in the production mode of operation) determines whether the samples for that motor falls within the variance limits for that particular motor and from the signature analyzes the motor defects. These are displayed, the motor under test is unclamped, and the next motor to be tested is clamped into position on platform 3.

With the present system, 100% of the motors of a production run can be tested in the same time as it previously took to spot test the motors. It should also be noted that since the computed parameter values are ratio based, the result is relatively independent of variations in line voltage.

Numerous variations, within the scope of the appended claims, will be apparent to those skilled in the art in light of the foregoing description and accompanying drawings.

What is claimed is:

1. A method of testing an electric motor having a frame and motor windings, comprising the steps of:
   sensing the phase of an alternating current waveform to be applied to the windings of an electric motor to be tested;
   applying the alternating current waveform to the windings in response to the phase of the waveform reaching a preselected value to start the motor;
   sampling the voltage and current applied by the alternating current waveform to the motor windings during shorting at predetermined times measured from the application of the waveform to the motor until a predetermined number of voltage and current samples are obtained;
   generating parameter samples from the voltage and current samples, said parameter being a function of the applied voltage and current;
   comparing the parameter samples with a previously obtained set of reference parameter sample values, said reference sample values having error limits for each reference sample value; and
   rejecting the motor if at least a predetermined number of the parameter samples fall outside the error limits for those particular samples.

2. The method as set forth in claim 1 wherein the motor under test is free running.

3. The method as set forth in claim 1 wherein the parameter samples are a function of the ratio of the applied voltage and the current samples.

4. The method as set forth in claim 1 wherein the motor is rejected if any parameter sample falls outside the error limits for that particular sample.

5. The method as set forth in claim 1 further including the step of examining the parameter samples of a rejected motor to identify defects of that motor.

6. The method as set forth in claim 5 including the step of preparing a sequence of results of the comparing step and comparing the sequence of results with a plurality of patterns of such results, each pattern representing a different motor defect, to determine the identity of the defect in a particular motor.

7. The method as set forth in claim 1 wherein the error limits for the reference parameter sample values are obtained recursively.

8. The method as set forth in claim 1 wherein the reference parameter sample values are obtained in a multi-step process starting with the sampling of voltage and current of a plurality of nearly identical motors to determine a baseline of parameter sample values for the subsequent steps.

9. The method as set forth in claim 8 wherein the multi-step process includes testing a relatively large number of motors against the baseline to expand the error limits for the samples.

10. The method as set forth in claim 9 wherein motors initially rejected against the baseline are retested after the relatively large number of motors have been tested.

11. The method as set forth in claim 8 wherein the plurality of nearly identical motors are tested a plurality of times to determine the baseline.

12. The method as set forth in claim 1 wherein for each of a series of motors to be tested the voltage is initially applied to each motor at the same point on the voltage waveform.

13. The method as set forth in claim 12 wherein the point on the voltage waveform at which voltage is initially applied to the motor is approximately equal to the power factor of the motor under test at locked rotor, said power factor being an angle which is the optimum for minimum transients.

14. The method as set forth in claim 13 wherein the point on the voltage waveform at which voltage is initially applied to the motor is from about 70° to about 80° after a polarity transition of the voltage waveform.

15. The method as set forth in claim 1 wherein the samples for a motor under test are equally spaced in time.

16. The method as set forth in claim 1 wherein the number of samples exceeds three hundred.

17. The method as set forth in claim 16 wherein approximately five hundred voltage samples are taken for the motor under test.

18. The method as set forth in claim 1 wherein the method is performed once with a relatively low voltage applied to the motor and once with a standard voltage such as 120V applied to the motor, the reference parameter sample values being different for low voltage testing than the reference parameter sample values for the standard voltage testing.

19. The method as set forth in claim 1 wherein the first current sample gives the locked rotor current for the motor under test.

20. The method as set forth in claim 19 wherein the motor is free running.

21. The method as set forth in claim 1 further including the step of applying a direct current voltage to the motor windings to stop the motor after the parameter samples have been generated.

22. The method as set forth in claim 1 further including the step of determining the direction of motor rotation by sensing the torque on the motor frame during starting.

23. The method as set forth in claim 21 further including the step of testing the balance of the motor by sensing the torque on the motor frame.

24. The method as set forth in claim 1 further including the step of determining the direction of motor rotation by sensing the motion of the motor frame during starting.

25. The method as set forth in claim 24 further including the step of testing the balance of the motor by sensing the motion of the motor frame.

26. The method as set forth in claim 1 further including the step of determining the power factor of the motor by comparing the voltage and current samples.

27. The method as set forth in claim 1 further including the step of determining the free running current of the motor from the current samples.

28. The method as set forth in claim 1 further including the step of sensing the temperature of the motor and compensating for any variation in parameter samples caused by the temperature of the motor.

29. The method as set forth in claim 1 further including the step of sensing the sound made by the motor during starting and rejecting the motor when a predetermined sound pattern is detected.

30. Apparatus for sequentially testing a series of nominally identical motors, each having a frame and motor windings, comprising:
   means for sensing the phase of an alternating current waveform to be applied to the windings of each electric motor to be tested;
   means for applying the alternating current waveform to the windings of each motor in sequence in response to the phase of the waveform reaching a preselected value to start the motor;
   means for sampling the voltage and current applied by the alternating current waveform to the motor windings at predetermined times measured from the application of the waveform to the motor under test until a predetermined number of voltage and current samples are obtained; and
   means for generating parameter samples from the voltage and current samples, said parameter being a function of the applied voltage and current, for comparing the parameter values with a previously obtained set of reference parameter sample values, said reference sample values having error limits for each reference sample value, and for determining if at least a predetermined number of the parameter samples fall outside the error limits for those particular samples.

31. The apparatus as set forth in claim 30 wherein the point on the voltage waveform at which the alternating current waveform is initially applied to the motor is approximately equal to the power factor of the motor under test at locked rotor, said power factor being an angle which is the optimum for minimum transients.

32. The apparatus as set forth in claim 31 wherein the alternating current waveform is initially applied to the motor about 70° to about 80° after a polarity transition of the voltage waveform.

33. The apparatus as set forth in claim 31 wherein the means for applying the alternating current waveform includes means for applying a waveform having a relatively low voltage during a first predetermined time interval, said sampling means taking a first set of voltage and current samples during said first predetermined time interval, and means for applying a waveform having a second, relatively higher voltage during a second predetermined time interval, said sampling means taking a second set of voltage and current samples during said second predetermined time interval.

34. The apparatus as set forth in claim 31 further including means responsive to the completion of the sampling of the voltage and current for applying a direct current voltage to the motor windings of the motor under test to stop said motor.

35. The apparatus as set forth in claim 31 including means for sensing the torque on the motor frame of the motor under test.

36. The apparatus as set forth in claim 35 wherein the apparatus includes means responsive to the torque sensing means for determining the direction of rotation of the motor.

37. The apparatus as set forth in claim 35 wherein the apparatus includes means responsive to the torque sensing means for testing the balance of the motor under test.

38. The apparatus as set forth in claim 31 further including means for sensing the temperature of the motor, said apparatus being responsive to the temperature value falling outside a predetermined range to change the reference parameter sample values.

39. A motor test system comprising:
   a platform fixed at one end and free at the opposite end;
   means for fixedly securing a motor to be tested to the platform so that torque generated by the motor, when running, is applied to the platform;
   accelerometer means for sensing the direction of the torque applied to the platform by the running motor and for supplying an output indicative of said torque direction; and
   electronic logic means responsive to the accelerometer means for determining solely from the output of the accelerometer means the direction of rotation of the motor under test.

* * * * *